United States Patent
Chang et al.

(10) Patent No.: US 6,613,690 B1
(45) Date of Patent: Sep. 2, 2003

(54) APPROACH FOR FORMING A BURIED STACK CAPACITOR STRUCTURE FEATURING REDUCED POLYSILICON STRINGERS

(75) Inventors: Chung-Wei Chang, Hsin-Chu (TW); Kuo-Chyuan Tzeng, Hsin-Chu (TW); Chen-Jong Wang, Hsin-Chu (TW); Min-Hsiang Chiang, Taipei (TW); Chi-Hsing Lo, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/197,318

(22) Filed: Jul. 17, 2002

(51) Int. Cl.⁷ .............................................. H01L 21/302
(52) U.S. Cl. ...................... 438/712; 438/692; 438/706; 438/745
(58) Field of Search ................................ 438/396, 400, 438/424, 690, 691, 692, 707, 745

(56) References Cited

U.S. PATENT DOCUMENTS

| | | | |
|---|---|---|---|
| 4,385,975 A | * 5/1983 | Chu et al. ................ | 204/192 E |
| 5,065,273 A | 11/1991 | Rajeevakumar ............. | 361/313 |
| 5,077,234 A | * 12/1991 | Scoopo et al. ................ | 437/67 |
| 5,100,823 A | 3/1992 | Yamada ........................ | 437/52 |
| 5,723,374 A | 3/1998 | Huang et al. ................ | 438/253 |
| 5,759,262 A | 6/1998 | Weimer et al. ................ | 117/88 |
| 6,130,126 A | 10/2000 | Iwakiri ........................ | 438/253 |
| 6,420,226 B1 | * 7/2002 | Chen et al. .................. | 438/238 |

* cited by examiner

*Primary Examiner*—Vu A. Le
*Assistant Examiner*—Brad Smith
(74) *Attorney, Agent, or Firm*—George O. Saile; Stephen B. Ackerman

(57) ABSTRACT

A process for forming a buried stack capacitor structure in a recessed region of a shallow trench isolation (STI) region, has been developed. The process features a unique sequence of procedures eliminating possible polysilicon stringers or residuals which if left remaining would result in leakage or shorts between conductive elements. The unique sequence of procedures include: deposition of a silicon oxide layer on the polysilicon layer from which the storage node structure will be defined from; photoresist plugs used to protect the portions of the silicon oxide and the underlying polysilicon layer located in the recessed region, during definition of the polysilicon storage node structure; and definition of the polysilicon storage node structure via a wet etch procedure, using the silicon oxide layer for protection of the underlying polysilicon storage node structure.

30 Claims, 6 Drawing Sheets

APPROACH FOR FORMING A BURIED STACK CAPACITOR STRUCTURE FEATURING REDUCED POLYSILICON STRINGERS

BACKGROUND OF THE INVENTION (1) Field of the Invention

The present invention relates to methods used to fabricate semiconductor devices, and more specifically to a method used to fabricate a buried stack capacitor structure.

(2) Description of Prior Art

Buried stack capacitor structures, used as components for dynamic random access memory (DRAM), as well as for static random access memory (SRAM), devices can in part be formed via a chemical mechanical polishing (CMP) procedure applied to a polysilicon layer, defining the polysilicon storage node for these devices. However the topography presented prior to the formation of the buried stack capacitor, polysilicon storage node structure, can sometimes result in unwanted polysilicon stringers, or residual polysilicon, located between individual storage node structures, or between a storage node structure and an adjacent component. The combination of severe topography, excellent contouring properties of chemically vapor deposited polysilicon layers, and anisotropic dry etch, or CMP procedures, increase the risk of polysilicon stringers or residuals on the sides of isolation features. In addition the CMP procedure, used to define a bottom polysilicon node, or polysilicon storage node structure, terminating on a polysilicon surface, can result in unwanted roughness, or damage of, the top surface of the polysilicon storage node structure, sometimes resulting in leakage exhibited by a subsequently formed, overlying dielectric layer.

This invention will teach a process sequence used to form the bottom electrode of buried stack capacitor structures, in which polysilicon stringers and residuals, are eliminated. The process sequence employs the use of a silicon oxide layer on the polysilicon layer used for the bottom electrode structure, photoresist planarization, etch back, and selective wet etch procedures, with the combination of these procedures resulting in buried stacked capacitor structures, absent of the yield degrading polysilicon stringers and polysilicon residuals. Prior art, such as Huang et al, in U.S. Pat. No. 5,723,374, describe a process for preventing polysilicon stringers in stacked capacitor DRAM devices, however that prior art does not employ the unique combination of process steps described in this present invention, used to improve the yield of devices featuring buried stacked capacitor structures, via the elimination of polysilicon stringers and residuals.

SUMMARY OF THE INVENTION

It is an object of this invention to fabricate buried stack capacitor structures for DRAM, and SRAM devices, in recesses formed in shallow trench isolation (STI) regions.

It is another object of this invention to deposit an insulator layer on the blanket polysilicon layer to be used for the bottom electrode, or storage node structure, of the buried stack capacitor structure.

It is still another object of this invention to employ photoresist planarization and etch back procedures to form protective photoresist plugs on the storage node materials located in the STI recessed regions, during the dry etch procedures used to remove these same materials located in other regions of the device.

In accordance with the present invention a process sequence used to form buried stack capacitor structures in recesses in an STI region, featuring photoresist planarization, and selective etching procedures used to form the buried stack capacitor polysilicon storage node component, used to eliminate polysilicon stringers, and used to minimize polysilicon damage during the storage node definition process, is described. After formation of an STI region in a top portion of a semiconductor substrate, a silicon nitride layer is deposited and patterned with openings in the silicon nitride layer exposing portions of the STI region. Recesses in the STI region are formed using the openings in the silicon nitride as a mask to allow for subsequent accommodation of the buried stack capacitor structure, with an unetched portion of STI, or OD, (wherein OD is oxide defined, active device region of the semiconductor substrate), overlaid with an unetched portion of silicon nitride, located between the recesses in the STI region. A polysilicon layer is deposited, followed by the deposition of a silicon oxide layer. A planarizing photoresist layer is formed, followed by etch back of the photoresist layer exposing the top surface of the silicon oxide layer in regions in which silicon oxide and the underlying polysilicon layer are not located in the recessed regions of, or in the bins of, the STI region, while unremoved regions of the photoresist layer, or photoresist plugs, remain overlying the silicon oxide and polysilicon layers located in the STI recesses. After selective removal of the exposed regions of silicon oxide, now exposed portions of polysilicon are removed, resulting in the definition of individual, isolated, polysilicon bottom electrode, or storage node structures, each located in an STI recess. The unwanted portions of polysilicon are either removed via a dry etching procedure, with the photoresist plugs in the recessed STI regions still remaining, or via wet etch procedure, performed after removal of the photoresist plug. Removal of silicon oxide located on the polysilicon storage node structure is followed by selective removal of silicon nitride, exposing an active device region. Formation of a capacitor dielectric layer, on the polysilicon storage node structure, followed by formation of an overlying top electrode structure, complete the formation of the buried stack capacitor structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
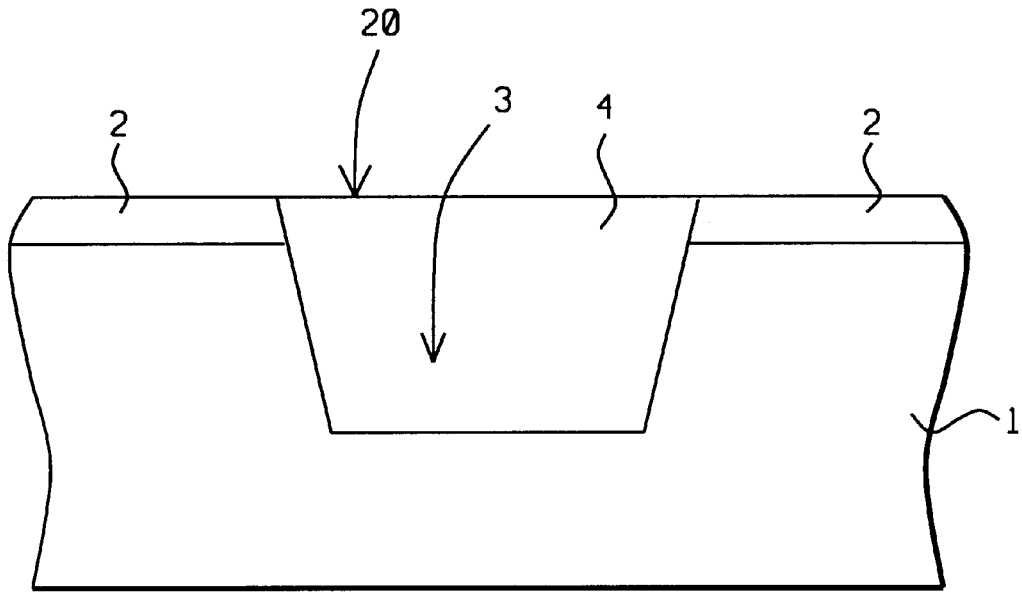
FIGS. 1–11, which schematically, in cross-sectional style, show key stages of fabrication used to fabricate buried stack capacitor structures in STI recesses, featuring photoresist planarization, and selective etching procedures used to eliminate polysilicon stringers formed during the definition of the polysilicon bottom electrode structure.

The method of forming a polysilicon bottom electrode structure, for a buried stack capacitor structure located in an STI bin, featuring photoresist planarization, and selective etching procedures used to eliminate polysilicon stringers formed during, as well as damage to a polysilicon layer created during, the definition of the polysilicon bottom electrode structure, will now be described in detail. Semiconductor substrate 1, comprised of single crystalline silicon, featuring a <100> crystallographic orientation, is used and schematically shown in FIG. 1. A composite insulator layer 2, comprised of an overlying layer of silicon nitride and an underlying layer of silicon dioxide is formed on the top surface of semiconductor substrate 1. Underlying silicon dioxide layer is obtained via thermal oxidation procedures at a thickness between about 100 to 500 Angstroms, while the overlying silicon nitride layer is obtained via low pressure chemical vapor deposition (LPCVD), or plasma enhanced vapor deposition (PECVD) procedures, at a thickness between about 500 to 1500 Angstroms. A photoresist shape, not shown in the drawings, is used as a mask to allow a reactive ion etching (RIE) procedure to define an opening in composite insulator layer 2, and to define the shallow trench shape 3, in a top portion of semiconductor substrate 1, to a depth between about 3000 to 4500 Angstroms. This is accomplished using $CHF_3$ or $CF_4$ as an etchant for composite insulator 2, while using $Cl_2$ or $SF_6$ as an etchant for silicon. Shallow trench shape 3, in the top portion of semiconductor substrate 1, can be defined with tapered sides, at an angle between about 80 to 88°, as schematically shown in FIG. 1, via use of a RIE pressure between about 4 to 200 mtorr. Shallow trench shape can also be formed with straight sides, using a more anisotropic RIE procedure, at a decreased RIE pressure between about 4 to 200 mtorr. After removal of the shallow trench shape defining photoresist shape, via plasma oxygen ashing, silicon oxide layer 4, is deposited, completely filling shallow trench shape 3. Silicon oxide layer 4, is obtained LPCVD or PECVD procedures, at a thickness between about 4000 to 7000 Angstroms, using tetraethylorthosilicate (TEOS), as a source. If desired a thermally grown, silicon dioxide layer can be used as a liner layer in shallow trench shape 3, prior to filling with silicon oxide layer 4. A chemical mechanical polishing (CMP) procedure is next used to remove portions of silicon oxide layer 4, from the top surface of the silicon nitride component of composite insulator layer 2, resulting in a planarized, STI region 20. This is schematically shown in FIG. 1.

Figure 2:
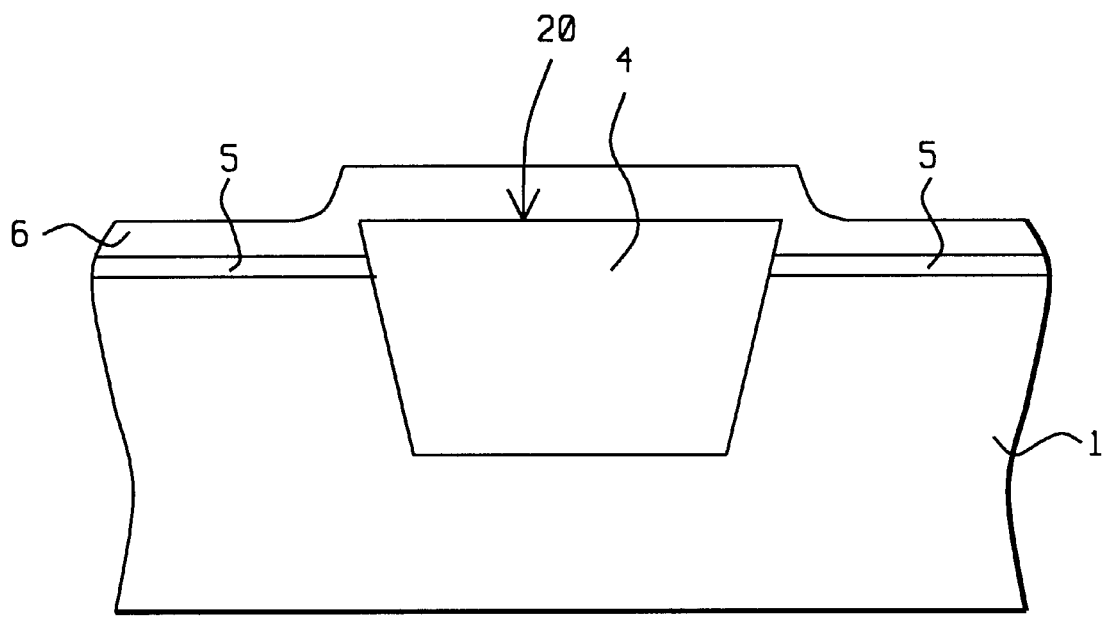

After removal of composite insulator layer 2, using a hot phosphoric acid solution for the silicon nitride component, and a buffered hydrofluoric acid solution for the silicon dioxide component of composite insulator layer 2, silicon dioxide layer 5, is thermally grown at a thickness between about 100 to 250 Angstroms, on portions of the top surface of semiconductor substrate 1, not occupied by STI region 20. Silicon nitride layer 6, is then deposited via LPCVD or PECVD procedures, at a thickness between about 500 to 1000 Angstroms. The result of these procedures are schematically shown in FIG. 2.

Figure 3:
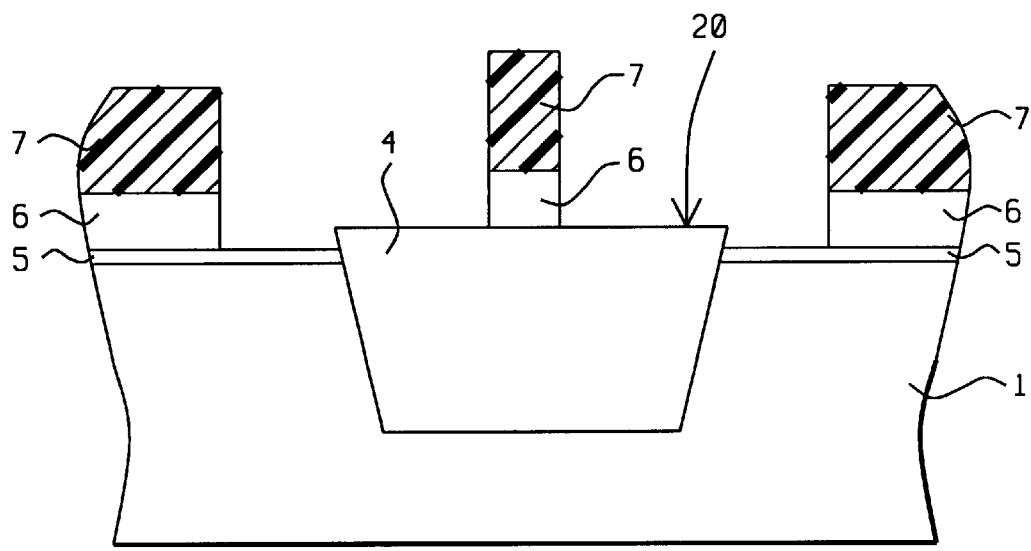
Figure 4:
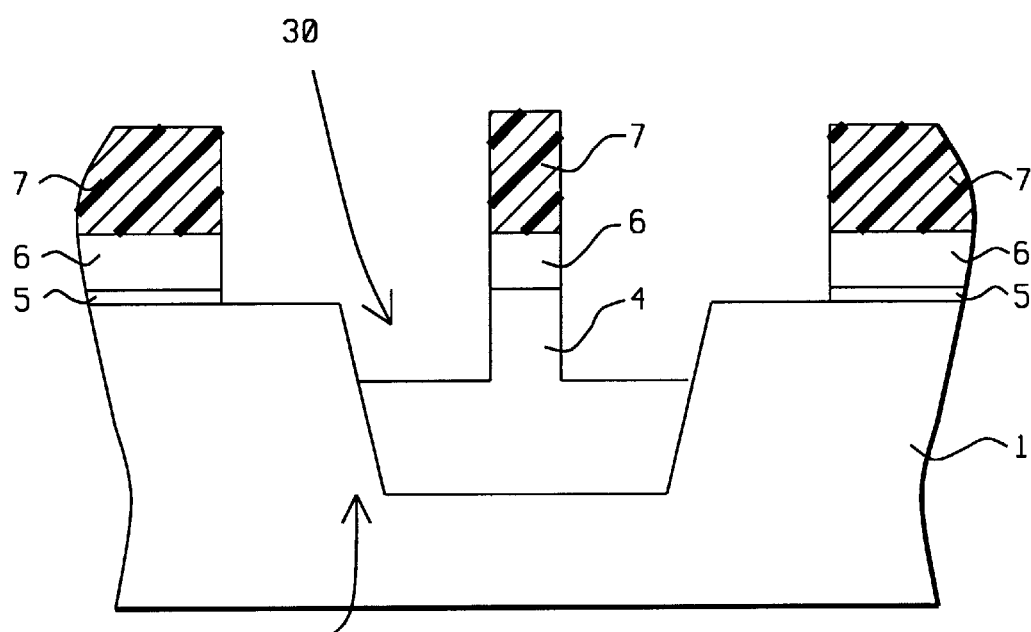

The creation of STI recessed regions, or STI bins, used to accommodate buried stack capacitor structures, is next addressed and described schematically using FIGS. 3–4. Photoresist shape 7, is defined and first used as a mask to allow a first phase of an anisotropic RIE procedure to remove portions of silicon nitride layer 6, exposed in openings in photoresist shape 7. The first phase of the anisotropic RIE procedure is performed using $Cl_2$ as an etchant, allowing the exposed portions of silicon nitride layer 6, to be selectively removed, with the RIE procedure terminating at the appearance of silicon oxide layer 5, and of silicon oxide layer 4. The opening in photoresist shape 7, exposes portions of STI regions 20, in which the STI recess regions will be formed in, as well as exposing portions of semiconductor substrate 1, located adjacent to STI region 20. This is schematically shown in FIG. 3. A second phase of the anisotropic RIE procedure is next performed, using $CHF_3$ as an etchant, allowing exposed regions of silicon oxide to be selectively removed. Thin silicon oxide layer 5, located adjacent to STI region 20, is first removed, exposing portions of semiconductor substrate 1, with the second cycle of the anisotropic RIE procedure continuing to remove regions of STI region 20, creating STI recessed region, or STI bins 30. STI bins 30, are formed to a depth between about 1000 to 3000 Angstroms, in STI region 20, and comprised with a diameter between about 0.2 to 0.5 um. The unetched, or regions of STI region 20, protected by overlying photoresist shape 7, during the anisotropic RIE procedure, and used to isolate subsequent, individual buried stack capacitor structures, is referred to as OD 40. The result of the second phase of the anisotropic RIE procedure is schematically shown in FIG. 4.

Figure 5:
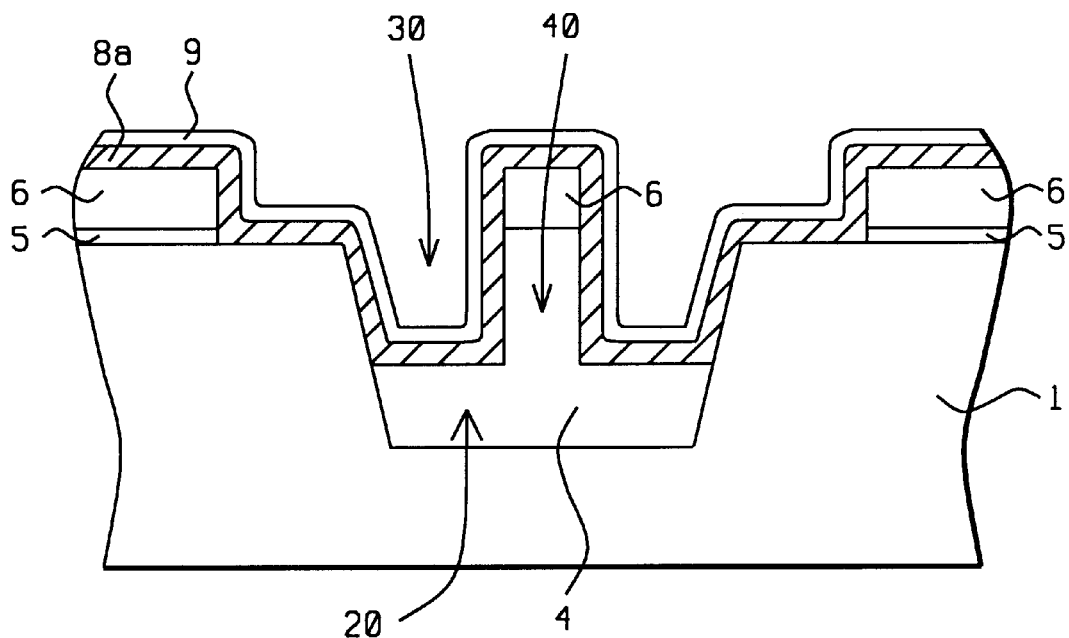

After removal of photoresist shape 7, via plasma oxygen ashing, polysilicon layer 8a, is deposited via LPCVD procedures at a thickness between about 300 to 1000 Angstroms. Polysilicon layer 8a, conformally covers all surfaces of STI recessed regions 30, as well as all surfaces of OD 40. Polysilicon layer 8a, is doped in situ during deposition via the addition of arsine, or phosphine, to a silane ambient. Silicon oxide layer 9, is next deposited on polysilicon layer 8a, via LPCVD or PECVD procedures, at a thickness between about 50 to 500 Angstroms. This is schematically shown in FIG. 5. Silicon oxide layer 9, will provide a stop layer for a subsequent, selective dry etch procedure.

Figure 6:
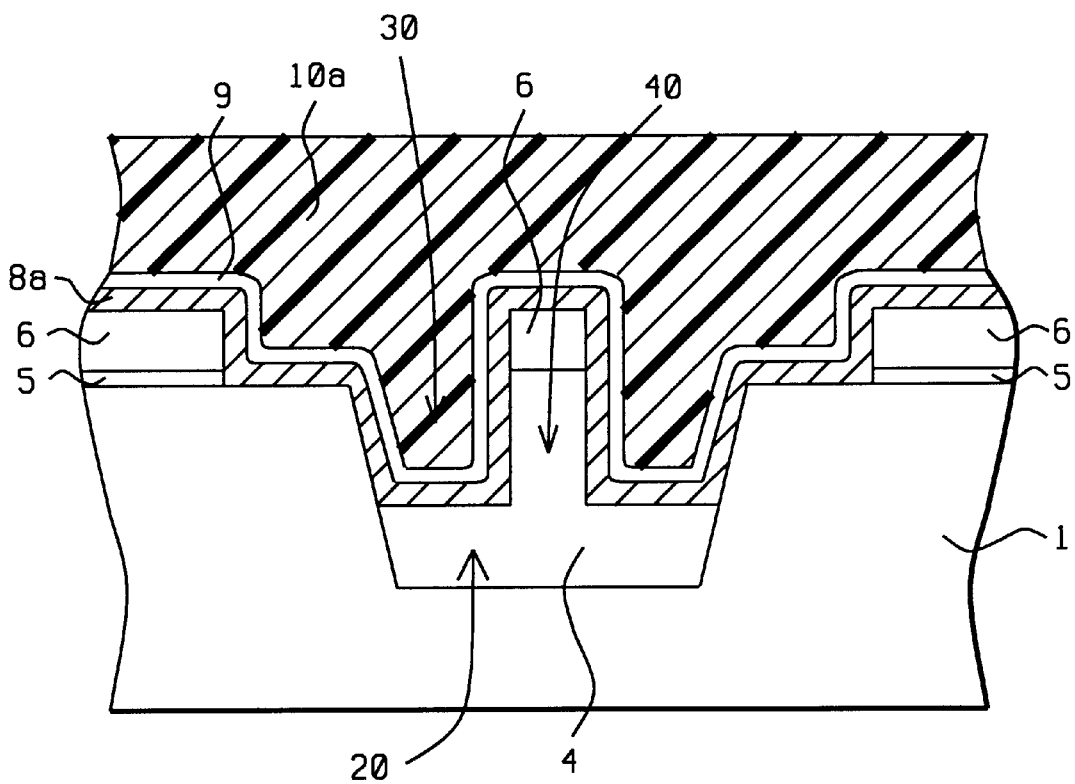
Figure 7:
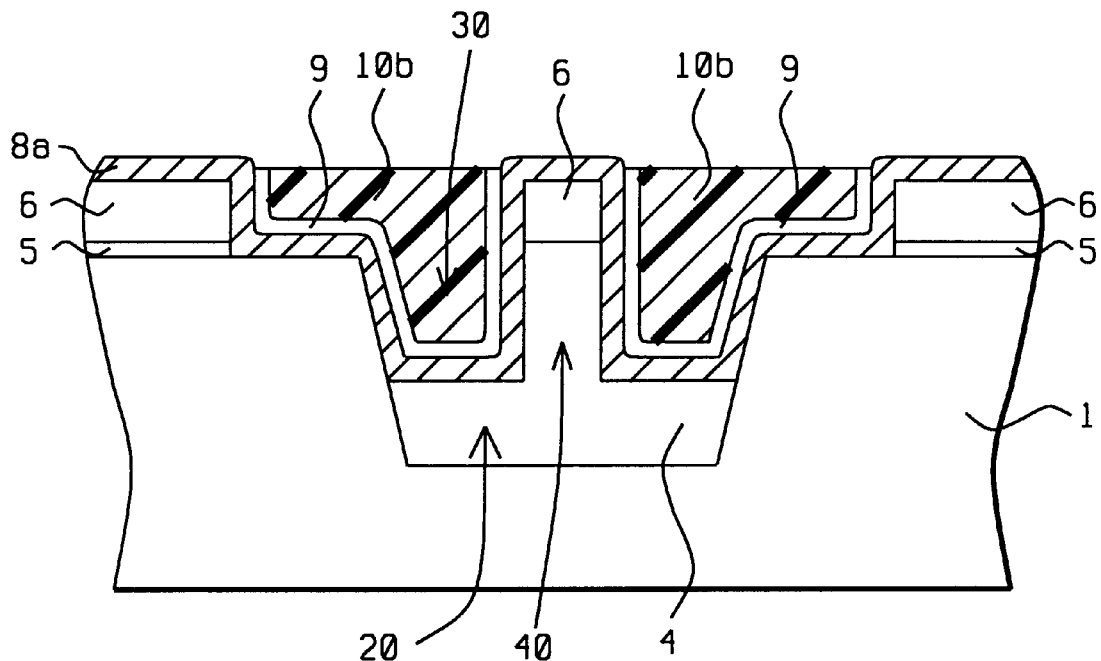

Photoresist layer 10a, is next applied, completely covering all features of the underlying structure. This is schematically shown in FIG. 6. Etch back of photoresist layer 10a, is next performed via a RIE procedure using oxygen as an etchant for photoresist. The oxygen RIE procedure is terminated at the appearance of silicon oxide layer 9. If desired, exposure of silicon oxide layer 9, can be accomplished via a CMP procedure, removing top portions of photoresist layer, terminating the CMP procedure again at the appearance of silicon oxide layer 9. These procedures result in photoresist plugs 10b, located overlying the portions of silicon oxide layer 9 and polysilicon layer 8a, located in STI recessed regions 30. A selective RIE procedure, using $CHF_3$ as an etchant, is used to remove portions of silicon oxide layer 9, not protected by photoresist plugs 10b, exposing portions of underlying polysilicon layer 8a. The result of these dry etch procedures is schematically shown in FIG. 7.

Figure 8:
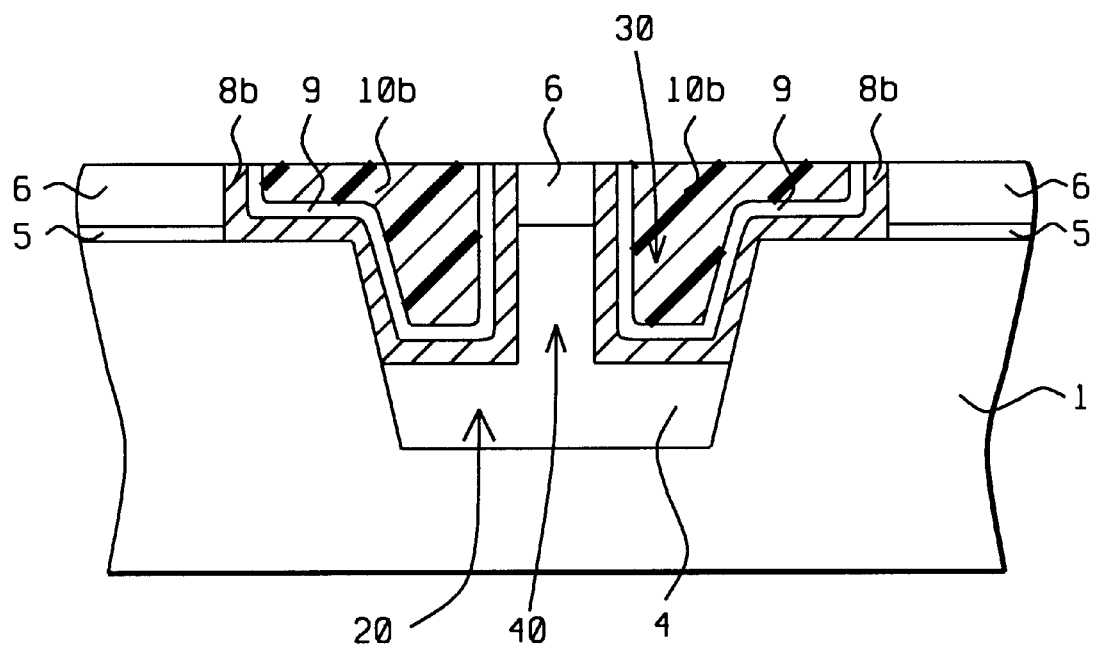
Figure 9:
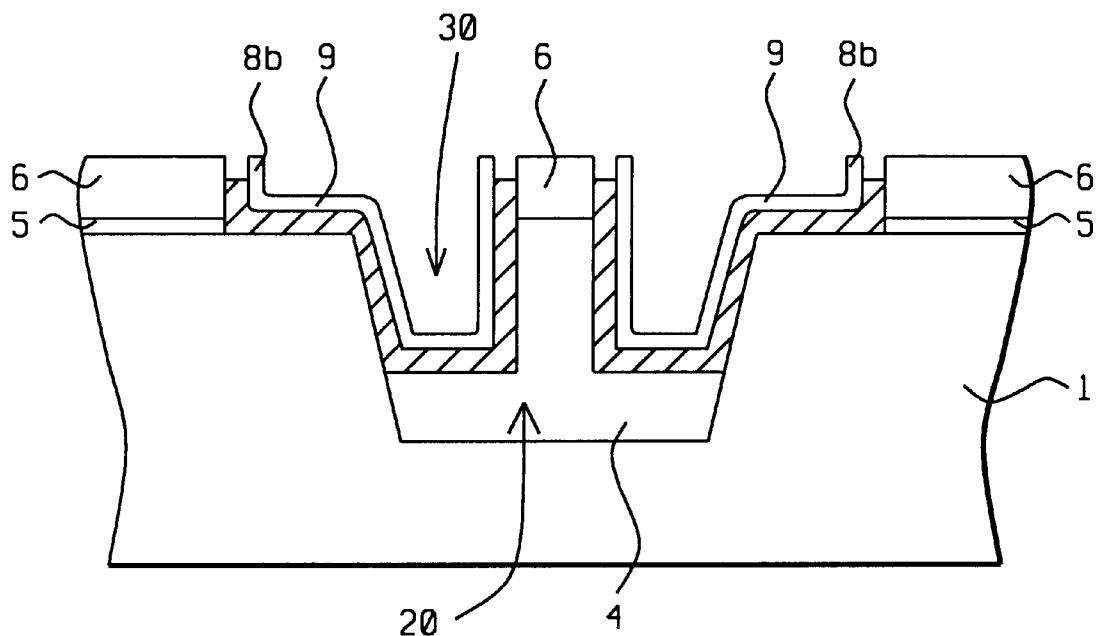

Removal of exposed regions of polysilicon layer 8a, resulting in definition of polysilicon storage node structures 8b, in STI recessed regions 30, is next addressed. A first option for removal of exposed portions of polysilicon layer 8a, is described schematically using FIG. 8. With photoresist plugs 10b, still located in STI recessed regions 30, a selective RIE procedure, using $Cl_2$ or $SF_6$ as an etchant, is used to remove portions of polysilicon layer 8a, from the top surface of silicon nitride layer 6. The smooth topography created by planarizing, photoresist plugs 10b, in addition to the selective dry etch removal procedures for exposed regions of silicon oxide layer 9, and polysilicon layer 8a, allowed polysilicon bottom structure, or storage node structure 8b, to be formed without polysilicon stringers, or residuals, which if formed could traverse OD region 40, resulting in electrical leakage or shorts between individual storage node structures. In addition photoresist plugs 10b, as well as silicon oxide layer 9, protected the polysilicon storage node structures from damage that may have occurred if unprotected polysilicon storage node structures were defined using only a CMP procedure. The result of a second option used to define polysilicon storage node structures 10b, is schematically shown in FIG. 9. After removal of photoresist plugs 10b, via plasma oxygen ashing, a dilute $NH_4OH$ solution is used to remove exposed portions of polysilicon layer 8a, located on silicon nitride layer 6. This wet etch procedure again results in the definition of polysilicon storage node structures 8b, located in STI recessed regions 30. The presence of silicon oxide layer 9, located on the portions of polysilicon layer 8a, in STI recessed regions 30, protected this portion of polysilicon from the NH$_4$OH solution. The second, or wet etch option, with its inherent isotropic etch component, further reduces the risk of polysilicon stringers or residuals, residing on vertical features.

Figure 10:
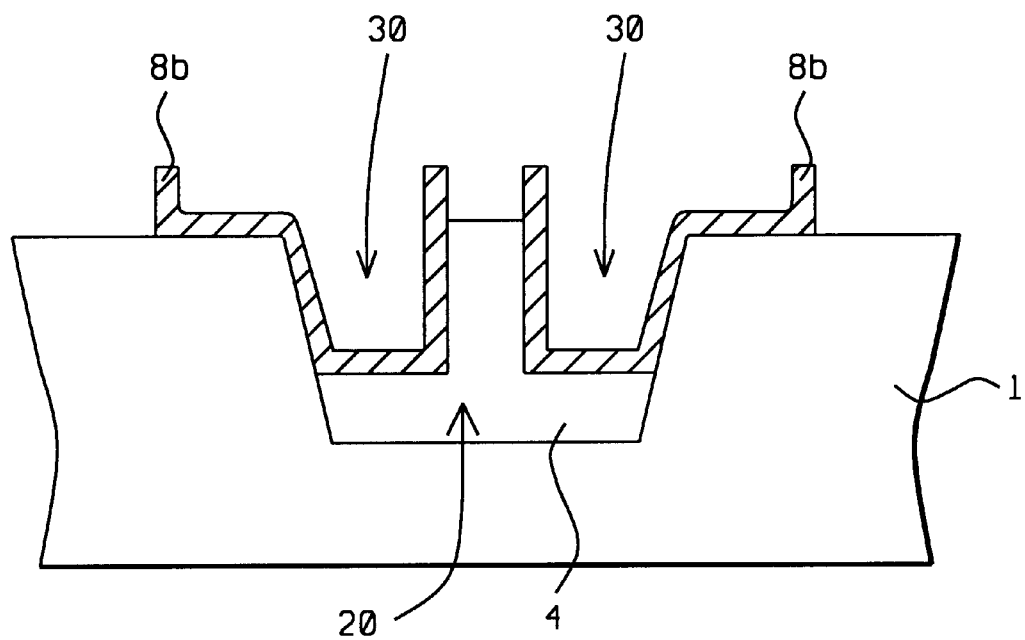

Silicon nitride layer 6, is next selectively removed via use of a hot phosphoric acid solution, followed by removal of underlying silicon oxide layer 5, via use of a buffered hydrofluoric (BHF), acid solution. The BHF procedure also removes silicon oxide layer 9, from the top surface of polysilicon storage node structures 8b, resulting in individual storage node structures in individual STI recessed regions, isolated from each other by OD region 40. This is schematically shown in FIG. 10.

Figure 11:
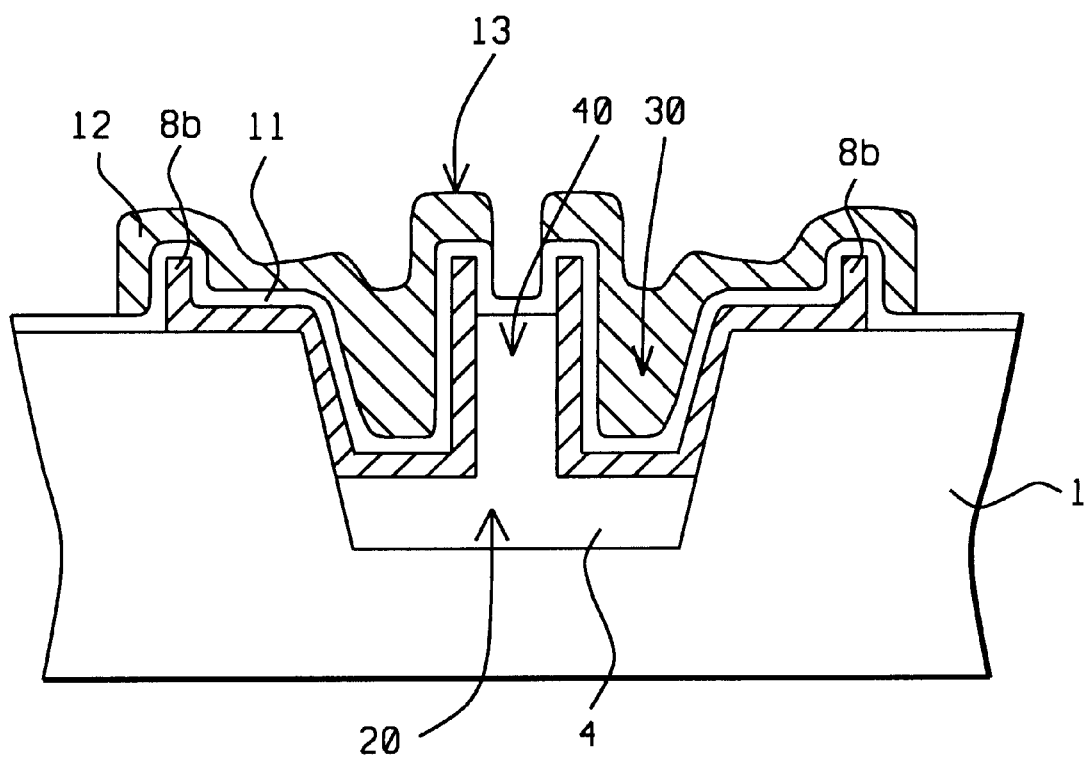

The completion of the buried stack capacitor structures, regarding formation of a capacitor dielectric layer, and of overlying top plate structures, are next described and schematically illustrated in FIG. 11. Dielectric layer 11, such as oxidized silicon nitride (NO), is formed at a thickness between about 40 to 65 Angstroms. Dielectric layer 11, is formed via deposition of a silicon nitride layer, using LPCVD or PECVD procedures, at a thickness between about 40 to 60 Angstroms, followed by thermal oxidation of a top portion of the silicon nitride layer, performed in an oxygen—steam ambient, at a temperature between about 700 to 800° C. If desired the capacitor dielectric layer can be comprised of tantalum oxide, or oxidized silicon nitride on silicon oxide (ONO). A polysilicon layer is then deposited via LPCVD procedures to a thickness between about 500 to 1500 Angstroms, and doped during deposition via the addition of arsine, or phosphine to a silane ambient. Conventional photolithographic and RIE procedures, using Cl$_2$ or SF$_6$ as an etchant for polysilicon, are then employed to define polysilicon top plate structure 12. Buried stack capacitor structure 13, comprised of polysilicon top plate structure 12, capacitor dielectric layer 11, and polysilicon storage node structure 8b, located in STI recessed region 30, is isolated from neighboring buried stack capacitor structures by OD region 40, and free of undesired, interconnecting polysilicon stringers or residuals, as a direct result of the novel process sequence used to define the polysilicon storage node structures.

While this invention has been particularly shown and described with reference to the preferred embodiments thereof, it will be understood by those skilled in the art that various changes in form and details may be made without departing from the spirit and scope of this invention.

What is claimed is:

1. A method of forming a buried stack capacitor structure on a semiconductor substrate, comprising the steps of:
    forming a silicon oxide filled, shallow trench isolation (STI) region, in a top portion of said semiconductor substrate;
    forming recesses in said STI region, in which said recesses are separated;
    depositing a bottom electrode layer;
    depositing a dielectric layer;
    forming photoresist plugs on said dielectric layer, in regions in which said dielectric layer resides in said recesses in said STI region;
    selectively removing portions of said dielectric layer not protected by said photoresist plugs, exposing portions of said bottom electrode layer;
    selectively removing exposed portions of said bottom electrode layer not covered by said photoresist plugs, resulting in n storage node structures, comprised of said bottom electrode layer, located in said recesses in said STI region;
    forming a capacitor dielectric layer on said storage node structure; and
    forming top electrode plate structures resulting in buried stack capacitor structures.

2. The method of claim 1, wherein said shallow trench isolation (STI) regions are formed in a shallow trench shape, which in turn is defined in a top portion of said semiconductor substrate via an anisotropic RIE procedure using Cl$_2$ or SF$_6$ as an etchant for silicon, with the shallow trench shape formed with straight sides, using a RIE pressure between about 4 to 200 mtorr.

3. The method of claim 1, wherein said shallow trench isolation (STI) regions are formed in a shallow trench shape, which in turn is defined in a top portion of said semiconductor substrate via an RIE procedure using Cl$_2$ or SF$_6$ as an etchant for silicon, with the shallow trench shape formed with tapered sides, at an angle between about 80 to 88°, using a RIE pressure between about 4 to 200 mtorr.

4. The method of claim 1, wherein said STI regions are formed via filling of the shallow trench shape with a silicon oxide layer, obtained via LPCVD or PECVD procedures, using tetraethylorthosilicate as a source.

5. The method of claim 1, wherein said openings in said silicon nitride layer are formed via an anisotropic RIE procedure, using Cl$_2$ as an etchant.

6. The method of claim 1, wherein said recesses in said STI region are formed via an anisotropic RIE procedure using CHF$_3$ as an etchant for silicon oxide.

7. The method of claim 1, wherein each individual recess is formed to a depth between about 1000 to 3000 Angstroms in said STI region, and formed with a diameter between about 0.2 to 0.5 um.

8. The method of claim 1, wherein said bottom electrode layer is a polysilicon layer.

9. The method of claim 1, wherein said bottom electrode layer, comprised of polysilicon is obtained via LPCVD procedures, to a thickness between about 300 to 1000 Angstroms, and doped in situ during deposition via the addition of arsine, or phosphine to a silane ambient.

10. The method of claim 1, wherein said dielectric layer is a silicon oxide layer.

11. The method of claim 1, wherein said dielectric layer, comprised of silicon oxide, is obtained via LPCVD or PECVD procedures, at a thickness between about 50 to 500 Angstroms.

12. The method of claim 1, wherein portions of said dielectric not protected by said photoresist plugs, are selectively removed via a RIE procedure using CHF$_3$ as an etchant.

13. The method of claim 1, wherein portions of said bottom electrode layer not protected by said photoresist plugs, are selectively removed via a RIE procedure using Cl$_2$ or SF$_6$ as an etchant.

14. The method of claim 1, wherein portions of said bottom electrode layer not protected by said dielectric layer are selectively removed via a wet etch procedure, using NH$_4$OH as an etchant.

15. The method of claim 1, wherein said capacitor dielectric layer is an oxidized silicon nitride (NO) layer, obtained at a thickness between about 40 to 65 Angstroms.

16. A method of forming a buried stack capacitor structure on a semiconductor substrate, with said buried stack capacitor structure formed in a shallow trench isolation (STI) recess region, comprising the steps of:

forming a composite insulator layer on said semiconductor substrate, comprised of an underlying, first silicon dioxide layer, and an overlying first silicon nitride layer;

performing a first RIE procedure to form an opening in said composite insulator layer, and to form an underlying shallow trench shape in a top portion of said semiconductor substrate;

depositing a first silicon oxide layer completely filling shallow trench shape, and filling said opening in said composite insulator layer;

performing a chemical mechanical polishing procedure to remove regions of said first silicon oxide layer from the top surface of said composite insulator layer, forming a shallow trench isolation (STI) region, in said opening in said composite insulator layer and in said top portion of said semiconductor substrate;

removing said composite insulator layer;

growing a second silicon dioxide layer on portions of said semiconductor substrate not occupied by said STI region;

depositing a second silicon nitride layer;

forming a photoresist shape, with an opening in said photoresist shape exposing a portion of a top surface of said silicon nitride layer in a region in which said silicon nitride layer overlays said STI region;

performing a first cycle of a second RIE procedure to remove the portion of said second silicon nitride exposed in said opening in said photoresist shape, exposing a portion of the top surface of said STI region;

performing a second cycle of said second RIE procedure to remove the portion of STI region now exposed in said opening in said photoresist shape, creating said STI recess region in a top portion of said STI region;

depositing a first polysilicon layer;

depositing a second silicon oxide layer;

applying a photoresist layer completely filling said STI recess region;

performing a third RIE procedure to remove a top portion of said photoresist layer exposing top surface of said second silicon oxide layer in regions in which second silicon oxide layer, and said first polysilicon layer, reside on top surface of said silicon nitride layer, and with said third RIE procedure resulting in the formation of photoresist plugs on said second silicon oxide layer, in a region in which said second silicon oxide layer resides in said STI recess region;

performing a fourth RIE procedure to selectively remove portions of said silicon oxide not covered by said photoresist plugs, exposing portions of said polysilicon layer;

removing said photoresist plugs;

performing a wet etch procedure to selectively remove portions of said first polysilicon layer, not covered by said second silicon oxide layer, from top surface of said second silicon nitride layer, resulting in a polysilicon storage node structure located in said STI recess region, with said polysilicon storage node structure still covered by said second silicon oxide layer;

removing said second silicon nitride layer;

performing a wet etch procedure to remove said first silicon oxide layer from the top surface of said semiconductor substrate, and to remove said second silicon oxide layer from the top surface of said polysilicon storage node structure;

forming a capacitor dielectric layer on said polysilicon storage node structure;

depositing a second polysilicon layer; and patterning of said second polysilicon layer to form a polysilicon top plate, creating said buried stack capacitor structure, with said buried stack capacitor structure comprised of said polysilicon top plate structure, of said capacitor dielectric layer, and of said polysilicon storage node structure, located in said STI recess region.

17. The method of claim 16, wherein said shallow trench shape is defined in a top portion of said semiconductor substrate via said first RIE procedure, using $Cl_2$ or $SF_6$ as an etchant for silicon, with said shallow trench shape formed with straight sides, using a RIE pressure between about 4 to 200 mtorr.

18. The method of claim 16, wherein said shallow trench shape is defined in a top portion of said semiconductor substrate via said first RIE procedure, using $Cl_2$ or $SF_6$ as an etchant for silicon, and with the shallow trench shape formed with tapered sides, at an angle between about 80 to 88°, via use of a RIE pressure between about 4 to 200 mtorr.

19. The method of claim 16, wherein said first silicon oxide layer used to fill said shallow trench shape, is obtained via LPCVD or PECVD procedures, at a thickness between about 4000 to 7000 Angstroms, using tetraethylorthosilicate as a source.

20. The method of claim 16, wherein said second silicon nitride layer is obtained via LPCVD or PECVD procedures to a thickness between about 500 to 1000 Angstroms.

21. The method of claim 16, wherein said first cycle of said second RIE procedure, used to form said openings in said second silicon nitride layer, is performed using $Cl_2$ as an etchant.

22. The method of claim 16, wherein said second cycle of said second RIE procedure, used to form said STI recess region in said STI region, is formed using $CHF_3$ as an etchant for said first silicon oxide layer.

23. The method of claim 16, wherein said STI recess region is formed to a depth between about 1000 to 3000 Angstroms in said STI region, and formed with a diameter between about 0.2 to 0.5 um.

24. The method of claim 16, wherein said first polysilicon layer is obtained via LPCVD procedures, to a thickness between about 300 to 1000 Angstroms, and doped in situ during deposition via the addition of arsine, or phosphine to a silane ambient.

25. The method of claim 16, wherein said second silicon oxide layer is obtained via LPCVD or PECVD procedures, at a thickness between about 50 to 500 Angstroms.

26. The method of claim 16, wherein said photoresist plugs, located in said STI recess region, are formed via an etch back procedure featuring said third RIE procedure using oxygen as an etchant for said photoresist layer.

27. The method of claim 16, wherein portions of said second silicon oxide layer, not protected by said photoresist plugs, are selectively removed via a RIE procedure using $CHF_3$ as an etchant.

28. The method of claim 16, wherein portions of said first polysilicon layer, not protected by said second silicon oxide layer, are selectively removed via a wet etch procedure, using $NH_4OH$ as an etchant.

29. The method of claim 16, wherein said second silicon nitride layer is selectively removed via use of a hot phosphoric acid solution.

30. The method of claim 16, wherein said capacitor dielectric layer is an oxidized silicon nitride (NO) layer, obtained at a thickness between about 40 to 65 Angstroms.

* * * * *